(12) United States Patent
Bita et al.

(10) Patent No.: US 10,135,034 B1
(45) Date of Patent: Nov. 20, 2018

(54) DISPLAY DEVICE WITH PIXEL-INTEGRATED BLACK MATRIX AND ELLIPTICAL POLARIZER

(71) Applicant: Apple Inc., Cupertino, CA (US)

(72) Inventors: Ion Bita, Santa Clara, CA (US); Jean-Jacques P. Drolet, San Jose, CA (US); Enkhamgalan Dorjgotov, Mountain View, CA (US); Michael J. Brown, Campbell, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 15/449,348

(22) Filed: Mar. 3, 2017

Related U.S. Application Data

(60) Provisional application No. 62/304,071, filed on Mar. 4, 2016.

(51) Int. Cl.
| | |
|---|---|
| *H01L 51/52* | (2006.01) |
| *G02B 5/30* | (2006.01) |
| *G02B 5/00* | (2006.01) |
| *G02B 5/22* | (2006.01) |
| *G02B 27/28* | (2006.01) |
| *H01L 27/32* | (2006.01) |

(52) U.S. Cl.
CPC .......... *H01L 51/5284* (2013.01); *G02B 5/003* (2013.01); *G02B 5/223* (2013.01); *G02B 5/3041* (2013.01); *G02B 5/3083* (2013.01); *G02B 27/288* (2013.01); *H01L 27/3211* (2013.01); *H01L 51/5281* (2013.01)

(58) Field of Classification Search
CPC ................. H01L 51/5284; H01L 51/5293
See application file for complete search history.

(56) References Cited

U.S. PATENT DOCUMENTS

| | | | |
|---|---|---|---|
| 6,760,157 B1 * | 7/2004 | Allen ................... | G02B 5/3008 359/487.02 |
| 7,897,482 B2 * | 3/2011 | Toriumi .............. | H01L 27/1214 257/E21.6 |
| 8,471,446 B2 | 6/2013 | Eom et al. | |
| 9,075,201 B2 | 7/2015 | Chung | |
| 2006/0220549 A1 * | 10/2006 | Kim ....................... | B82Y 20/00 313/512 |
| 2007/0020404 A1 * | 1/2007 | Seiberle ................ | B29C 41/003 428/1.2 |
| 2008/0252974 A1 | 10/2008 | Futamura et al. | |
| 2010/0117528 A1 * | 5/2010 | Fukuda .................. | H01L 27/322 313/505 |
| 2010/0271580 A1 * | 10/2010 | Murakami ......... | G02F 1/133634 349/118 |
| 2014/0160404 A1 * | 6/2014 | Yamada .................. | G02B 5/208 349/96 |
| 2015/0042942 A1 * | 2/2015 | Hatanaka ............. | G02B 5/3016 349/194 |
| 2015/0261259 A1 * | 9/2015 | Endo ..................... | G06F 1/1652 361/679.06 |
| 2015/0364725 A1 | 12/2015 | Li | |
| 2017/0059932 A1 * | 3/2017 | Hong ................ | G02F 1/133528 |

* cited by examiner

*Primary Examiner* — Stephen Bradley
(74) *Attorney, Agent, or Firm* — Jaffery Watson Mendonsa & Hamilton LLC

(57) ABSTRACT

Display panel configurations are described in which a pixel-level integrated black matrix layer is combined with an elliptical polarizer. The elliptical polarizer may allow for increased transmission of emissive LEDs in the display panel, while the black matrix layer may mitigate internal reflection of ambient light.

15 Claims, 3 Drawing Sheets

$R_{TOTAL} = T_{parallel} * R_{BP} * T_{perp}$

DISPLAY DEVICE WITH PIXEL-INTEGRATED BLACK MATRIX AND ELLIPTICAL POLARIZER

RELATED APPLICATIONS

This application claims the benefit of priority of U.S. Provisional Application No. 62/304,071 filed Mar. 4, 2016, which is incorporated herein by reference.

BACKGROUND

Field

Embodiments described herein relate to display devices. More particularly, embodiments relate to display panels including a pixel-level integrated black matrix layer combined with an elliptical polarizer.

Background Information

Display panels based on organic light emitting diode (OLED) or liquid crystal display (LCD) technologies are commonly found in electronic devices such as wearables, phones, tablets, computers, and televisions. Demand is increasing for higher resolution displays, as well as for thinner, lighter weight, and lower cost electronic devices with larger screens. Conventional LCD backplanes include glass substrates with thin film transistor (TFTs) to control transmission of backlight though pixels based on liquid crystals. Conventional OLED backplanes use a similar TFT substrate to control emissive organic layers within the pixels.

In some implementations, a circular polarizer can be incorporated into the LCD or OLED front of screen display stacks over the respective backplane panels. For example, the circular polarizer may be incorporated into the panels to reduce glare associated with internal panel reflection of randomly oriented ambient light, for example by the display backplane. A common circular polarizer includes a linear polarizer film over a quarter wave optical retarder layer.

SUMMARY

Embodiments describe display panel configurations. In an embodiment, a display panel includes an array of emissive LEDs, a black matrix layer over the array of LEDs, and an elliptical polarizer directly over the black matrix layer. The black matrix layer may include a corresponding array of openings over the array of LEDs in which each opening is over a corresponding LED. In accordance with embodiments, the elliptical polarizer includes a quarter wave retarder layer over the black matrix layer, and a non-linear polarizer film over the quarter wave retarder layer. The elliptical polarizer may be characterized by a total transmission that is greater than a circular polarizer. For example, the elliptical polarizer may be characterized by a total transmission of greater than 50%. In an embodiment, the elliptical polarizer is characterized by a parallel transmission of at least 5%. The elliptical polarizer may additionally be characterized by a perpendicular transmission of at least 90%. Greater parallel transmission is possible in accordance with embodiments, such as at least 10%, 15%, or more in order to increase emissive efficiency.

The array of emissive LEDs may include a first group of LEDs designed for emission at a first peak wavelength, and a second group of LEDs designed for emission at a second peak wavelength, and the elliptical polarizer includes a dye characterized by an absorption peak between the first peak wavelength and the second peak wavelength. In an exemplary application the first peak wavelength corresponds to a red emission peak, the second peak wavelength corresponds to a blue emission peak, and the elliptical polarizer absorption peak is between the first and second peak wavelengths. Similar exemplary applications apply for different emitter colors. In an embodiment, the black matrix layer may include a dye characterized by an absorption peak between the first peak wavelength and the second peak wavelength. Exemplary dyes may be mixed molecule dyes with multiple absorption peaks between the first peak wavelength and the second peak wavelength.

In an embodiment, the black matrix layer comprises carbon-black particles with an average particle sizes less than 50 nm. In such an embodiment, the elliptical polarizer may include a dye, such as a dye characterized by an absorption peak in the blue spectrum.

In accordance with embodiments, the black matrix layer may reduce reflectivity of the panel stack. For example, the black matrix layer may be formed over an array of micro-driver chips surface mounted on the display backplane. Increased area of the black matrix layer may correspond to a decrease in reflectivity of the panel stack. For example, the black matrix layer may occupy greater than 80% of an active pixel area on the display backplane. In some embodiments, the black matrix layer may occupy 80%-95% of an active pixel area on the display backplane.

A plurality of the separately described embodiments and structures described may be combined in accordance with embodiments. For example, in one embodiment the elliptical polarizer is characterized by a parallel transmission of at least 5%, the array of emissive LEDs includes a first group of LEDs designed for emission at a first peak wavelength, and a second group of LEDs designed for emission at a second peak wavelength, and a panel component such as the black matrix layer and/or the elliptical polarizer includes a dye characterized by an absorption peak between the first peak wavelength and the second peak wavelength. In an embodiment, each opening in the black matrix layer is narrower than a corresponding LED.

DETAILED DESCRIPTION

Figure 1:
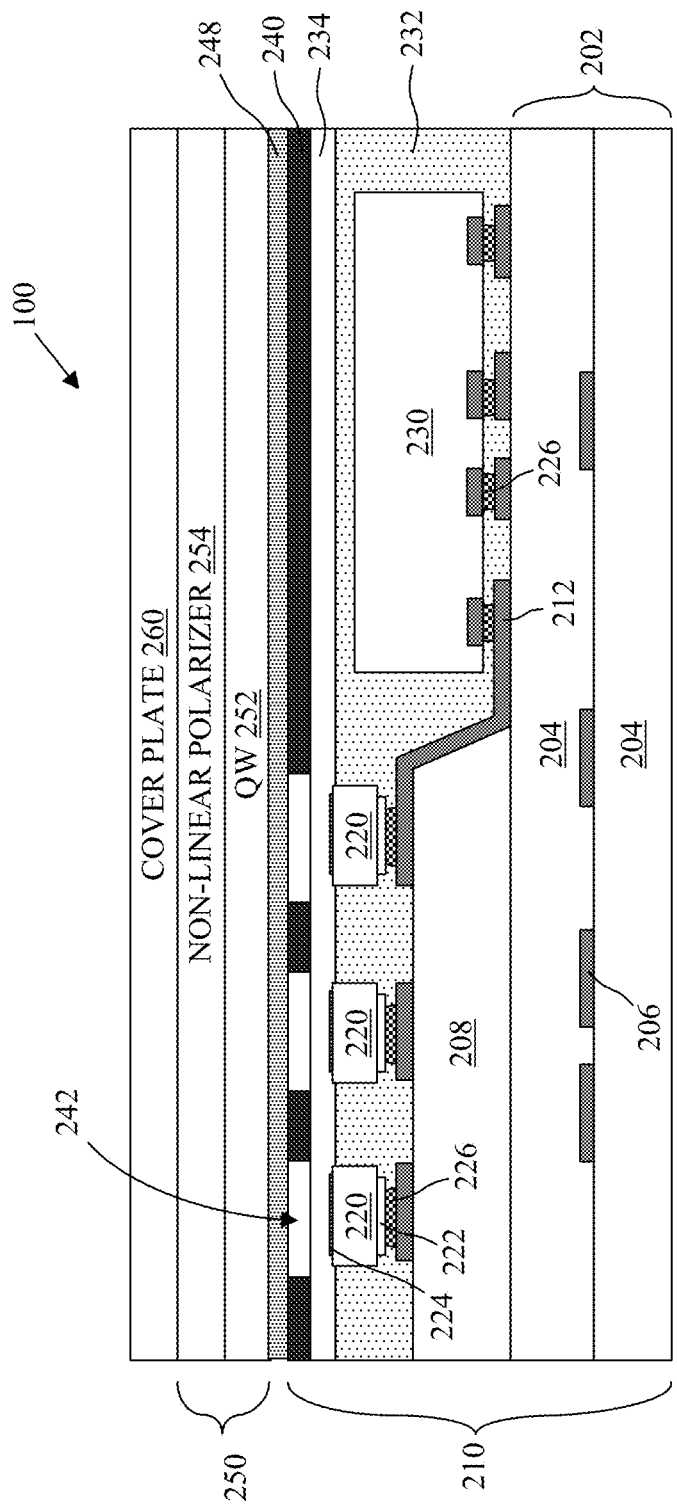
FIG. 1 is a schematic cross-sectional side view illustration of a display panel in accordance with an embodiment.

Embodiments describe emissive display panels including a pixel-level integrated black matrix layer combined with an elliptical polarizer. The display panel stack configurations may allow for increased emissive efficiency of the display panel while simultaneously enabling low reflectivity of the display stack under ambient illumination. In an embodiment, the black matrix layer is included to reduce internal reflection of the display panel, while an elliptical polarizer is introduced in the display stack to increase transmission and emission efficiency of the display panel.

In one aspect, the combination of a pixel-level integrated black matrix layer and elliptical polarizer allows for a reduced total internal panel reflection ($R_{TOTAL}$) of the display stack, such as in the 0-2% range, while at the same time allowing for increased efficiency of the pixel emission output to a viewer. For example, transmission (T) from the pixels to the viewer may be increased to greater than 50%. Additionally, emissive efficiency of the display panel may be increased by greater than 10%, or more specifically greater than 20% or even 25%, compared to use of a conventional circular polarizer in the display stack. In an embodiment, the black matrix layer may occupy greater than 80% of the active pixel area on the display backplane.

In another aspect, display panel structures are disclosed in which optical performance variation is reduced with view angle. This may be attributed to increased transmission along the directions parallel to the principal axis of the elliptical polarizer.

In another aspect, display panel structures are disclosed in which potential cost reductions may stem from simpler manufacturing costs for the elliptical polarizer compared to a circular polarizer, since there may be a reduced dependence on achieving a high extinction ratio of the polarization parallel to the principal axis of the elliptical polarizer compared to a circular polarizer.

The display panels described in accordance with embodiments including an elliptical polarizer and black matrix layer may be compatible with a variety of display technologies. For example, the display panels may include a backplane with self-emitting LEDs, such as an OLED backplane or a backplane including emissive micro LEDs (e.g. inorganic semiconductor-based LEDs). The backplanes may include a matrix of pixels, which may use passive matrix or active matrix addressing schemes. In some embodiments, the backplane may include working circuitry for operation of the matrix of pixels. For example, the backplane may include a TFT substrate, a substrate with redistribution lines, an array of microdriver chips, or a combinations thereof. In an embodiment, the backplane includes a TFT substrate with organic LEDs. In an embodiment, the backplane includes an array of surface mounted microdriver chips and micro LEDs.

In various embodiments, description is made with reference to figures. However, certain embodiments may be practiced without one or more of these specific details, or in combination with other known methods and configurations. In the following description, numerous specific details are set forth, such as specific configurations, dimensions and processes, etc., in order to provide a thorough understanding of the embodiments. In other instances, well-known semiconductor processes and manufacturing techniques have not been described in particular detail in order to not unnecessarily obscure the embodiments. Reference throughout this specification to "one embodiment" means that a particular feature, structure, configuration, or characteristic described in connection with the embodiment is included in at least one embodiment. Thus, the appearances of the phrase "in one embodiment" in various places throughout this specification are not necessarily referring to the same embodiment. Furthermore, the particular features, structures, configurations, or characteristics may be combined in any suitable manner in one or more embodiments.

The terms "front", "back", "over", "to", "between", and "on" as used herein may refer to a relative position of one layer with respect to other layers. One layer "over", or "on" another layer or bonded "to" or in "contact" with another layer may be directly in contact with the other layer or may have one or more intervening layers. One layer "between" layers may be directly in contact with the layers or may have one or more intervening layers.

FIG. 1 is a schematic cross-sectional side view illustration of a display panel in accordance with an embodiment. As illustrated, the display panel 100 may include a backplane 210 and elliptical polarizer 250 over the backplane 210. A cover 260 may optionally be formed over the elliptical polarizer 250. Cover 260 may include a single layer or a multilayer stack. For example, cover 260 may include a cover glass and lamination adhesive (e.g. optically clear). Cover 260 may optionally include a touch panel film, pressure sensitive adhesive, etc. As illustrated in FIG. 1, the display backplane 210 includes a display substrate 202. The display substrate 202 may be a variety of substrates in accordance with embodiments. The display substrate 202 may be may be rigid or flexible. For example, display substrate 202 may be formed of a variety of materials such as polymer, glass, silicon, metal foil, etc. In an embodiment, the display substrate 202 is a thin film substrate (TFT) substrate similar to conventional OLED display substrates. In the particular embodiment illustrated in FIG. 1, the display substrate includes one or more dielectric layers 204 and redistribution lines 206. For example, the redistribution lines 206 may include terminal lines, power supply lines, data lines, emission control lines, etc.

Still referring to FIG. 1, a bank layer 208 may be formed on the display substrate 202, followed by the formation of a patterned metal layer 212. For example, the patterned metal layer may include contact pads for bonding LEDs 220 and microdriver chips 230, for example with electrically conductive bumps 226, e.g. solder bumps. In an embodiment, the LEDs 220 may be formed of inorganic semiconductor-based materials and have a maximum lateral dimension of 1 to 300 μm, 1 to 100 μm, 1 to 20 μm, or more specifically 1 to 10 μm, such as 5 μm. Each LED 220 may have a bottom contact 222 and a top contact 224. In an embodiment a microdriver chip 230 can replace the switch(es) and optionally storage device(s) for each display element as commonly employed in a TFT architecture. The microdriver chips may include digital unit cells, analog unit cells, or hybrid digital and analog unit cells. Additionally, MOSFET processing techniques may be used for fabrication of the microdriver chips on single crystalline silicon as opposed to TFT processing techniques on amorphous silicon (a-Si) or low temperature polysilicon (LTPS).

Following the bonding of the LEDs 220 and microdriver chips 230 to the display substrate, a sidewall passivation layer 232 may then be formed around the LEDs 220 and microdriver chips 230. The sidewall passivation layer 232 may secure the LEDs 220 and microdriver chips 230 to the display substrate 202 and also provide a step function for application of the top conductive contact layer 234. In an embodiment, sidewall passivation layer 232 is formed by screen printing, slit coating, slot coating, ink jet printing, etc. around the LEDs 220 and microdriver chips 230. For example, a single slot coating layer can be applied across the display substrate 202 and around all of the LEDs 220 and microdriver chips 230. In an embodiment, the sidewall passivation layer 232 is formed of a thermoset material such as acrylic, epoxy, or BCB (benzocyclobutene). The top LED contacts 224 may be exposed after application of the sidewall passivation layer 232. In an embodiment, a plasma etch is performed after application of the sidewall passivation layer 232 to ensure the top LED contacts 224 are exposed. One or more top conductive contact layers 234 may then be applied over the array of LEDs 220 and microdriver chips 230 to electrically connect the LEDs 220 to the one or more terminal lines. For example, a terminal line and corresponding signal may be a ground line or some other low voltage (Vss) or reverse bias, power supply plane or some other high voltage level (Vdd), current source output, or voltage source output. Exemplary materials for the top conductive contact layer 234 include, but are not limited to, transparent conductive oxides (e.g. ITO) and transparent conductive polymers. While the specific embodiment described an illustrated in FIG. 1 includes LEDs 220 and microdriver chips 230 bonded to a display substrate 202, embodiments are not limited to this particular configuration. In other embodiments, a conventional OLED backplane may be utilized.

In an embodiment, a black matrix layer 240 is then formed over the one or more top conductive contact layers 234. In an embodiment, the black matrix layer 240 is formed by slot coating over the underlying substrate stack. For example, a slot coated black matrix layer 240 may be 1-2 μm thick. The black matrix layer 240 pattern may then be generated, for example, by photolithography using a negative tone black matrix photoresist to form openings 242 directly over corresponding LEDs 220. As illustrated, the black matrix layer 240 completely covers the microdriver chips 230.

Figure 2A:
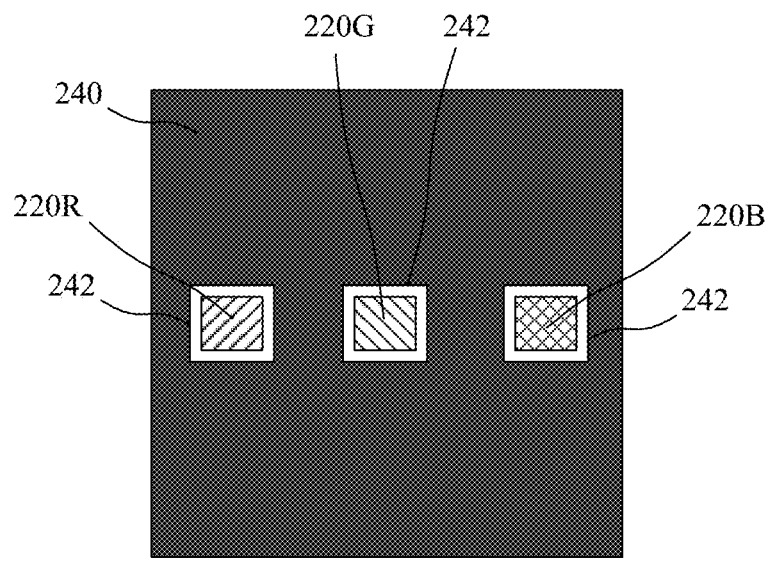
FIGS. 2A-2B are schematic top view illustrations of a patterned black matrix layer over a pixel in accordance with embodiments.
Figure 2B:
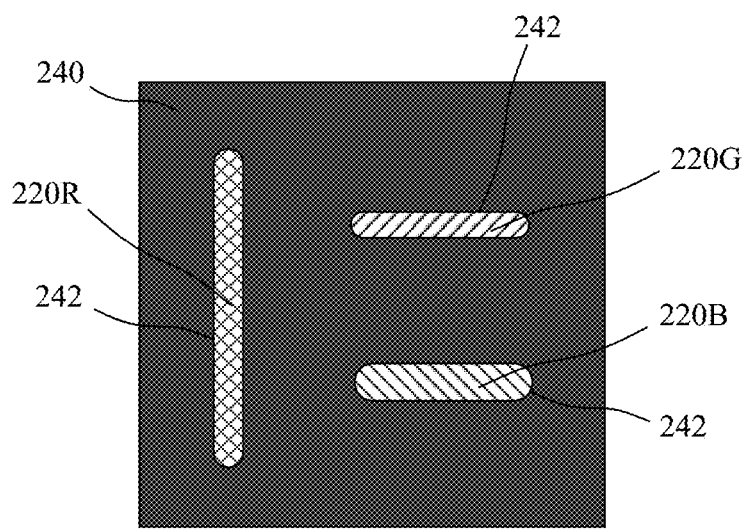

Referring briefly to FIGS. 2A-2B schematic top view illustrations are provided of a patterned black matrix layer 240 over a pixel in accordance with embodiments. For example, the exemplary pixel may be a RGB pixel, with red-emitting, green-emitting, and blue-emitting subpixels. FIG. 2A illustrates an embodiment in which one or more openings 242 are wider (e.g. larger area) than a corresponding LED 220 (e.g. 220R, 220B, 220G). FIG. 2B illustrates an embodiment in which one or more openings 242 are narrower (e.g. less area) than a corresponding LED 220 (e.g. 220R, 220B, 220G). In an embodiment, the LEDs 220 are inorganic semiconductor-based LEDs. In an embodiment, the LEDs 220 are OLEDs. In accordance with embodiments, size of the openings 242 can contribute the intensity of light emitted from the LEDs, as well as the reflectivity ($R_{BP}$) of the backplane 210. For example, openings 242 that are larger than the LEDs may allow for additional light reflection from bottom contacts (e.g. formed from metal layer 212) on which the LEDs are formed or bonded to. The black matrix layer may additionally inhibit internal reflection from other portions of the backplane 210, including from the microdriver chips 230, which may be formed of silicon. In an embodiment, the black matrix layer 240 occupies greater than 80% of the active pixel area, for example, defined by the resolution, or pixels per inch (PPI) of the display panel and size of individual emitters. In an embodiment, the black matrix layer 240 occupies 80%-95% of the active pixel area.

Referring again to FIG. 1, an elliptical polarizer 250 may be formed over the backplane 210 using a suitable technique such as lamination. For example, the elliptical polarizer 250 may be laminated onto the backplane with an adhesive layer 248, such as an optically clear pressure sensitive adhesive with a thickness in range of 15-25 μm. In accordance with embodiments, the elliptical polarizer may include a lower quarter wave retarder layer 252 and upper non-linear polarizer layer 254. The quarter wave retarder layer 252 and an upper non-linear polarizer layer 254 may be similar to a quarter wave retarder layer and linear polarizer layer found in a conventional circular polarizer, with one difference being the amount of transmission of the non-linear polarizer layer 254 compared to a conventional linear polarizer layer. For example, a conventional linear polarizer layer may be characterized as transmitting >90% of visible light oriented perpendicular to the principal axis of the linear polarizer layer, while transmitting <0.5% of visible light oriented parallel to the principal axis of the linear polarizer layer. In accordance with embodiments, a non-linear polarizer layer may be characterized as transmitting >5% (or more specifically >10%, or more) of visible light oriented parallel (T_par) to the principal axis of the non-linear polarizer layer, while transmitting >90% of visible light oriented perpendicular (T_perp) to the principal axis of the non-linear polarizer layer. In an embodiment, an increase in transmission of light emitted from the LEDs 220 is accomplished by reducing absorption along the parallel direction of the non-linear polarizer layer (compared to a linear polarizer layer) while maintaining the high transmission along the perpendicular direction (e.g. >90%). In an embodiment, this may be achieved by reducing the concentration of the absorber species (e.g. iodine or dye based light absorbing material) in the non-linear polarizer layer while maintaining the high degree of alignment of linear polarizers. In an embodiment, this may be achieved by reducing a thickness of the linear polarizer layer (compared to a linear polarizer layer within a circular polarizer).

In accordance with embodiments, specific polarizer materials can include engineered dichroic polarizers, such as those based on iodine doped polyvinyl alcohol (PVA), or dye doped polarizers. As an example, the non-linear polarizer can be achieved in iodine-based materials by reducing overall iodine concentration while controlling PVA thickness to stabilize low iodine concentration during device lifetime (reliability testing). In accordance with embodiments, specific polarizer materials can include dichroic dyes doped in a liquid crystalline polymer matrix. Due to the discrete nature of the absorption peaks of the dies, in this implementation the constituent dyes may have absorption spectrum peaks located in between the emissive peaks of the display panel. In accordance with embodiments, a highest absorption spectrum peak (or a plurality of the highest absorption spectrum peaks) is located in between the emissive peaks of the display panel. For example, absorption spectrum peaks may be located between emissive peaks of red-emitting, green-emitting, and blue-emitting LEDs 220 in an RGB arrangement, though other arrangements are possible. Thus, the elliptical polarizer may include spectral selective properties to increase transmission of any or all of the emitter wavelengths. This may lead to a further increase in emissive efficiency while allowing for reflection suppression after double pass through the elliptical polarizer.

Figure 3:
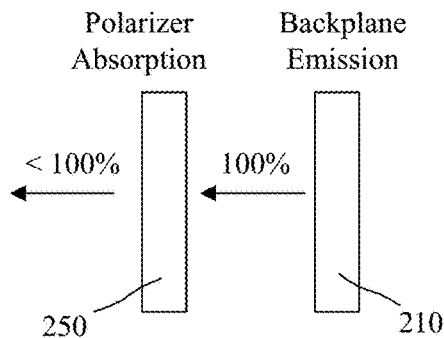
FIG. 3 is a schematic illustration of panel emission efficiency reduction due to polarizer absorption in accordance with embodiments.

FIG. 3 is a schematic illustration of panel emission efficiency reduction due to the elliptical polarizer absorption in accordance with embodiments. As a general principle, when a polarizer is positioned over a backplane the transmission of emitted light from the LEDs is reduced. For example, assuming a normalized 100% efficiency from a display backplane, a conventional circular polarizer may reduce panel transmission 50% or more (total transmission is calculated at 45.1% in Table 1 below). More specifically, a circular polarizer including a linear polarizer film may transmit 90% of perpendicular light, and absorb greater than 99% of parallel light. In accordance with embodiments, an elliptical polarizer includes a non-linear polarizer film. In such an arrangement, the degree of non-linearity controls the amount of transmission of the parallel light, and correspondingly, emissive efficiency of the display device. In an exemplary embodiment, the elliptical polarizer is characterized by a total transmission of greater than 50%, which may correspond to at least a 10% increase in emissive efficiency of the display panel. Table 1 provides simulation data for normalized emissive efficiency of a display panel including an elliptical polarizer with non-linear polarizer film, with a normalized 100% efficiency being that of a traditional circular polarizer with linear polarizer film. As shown, the emissive efficiency and total transmission of the display panel increases as a function of the increase in parallel light transmission (T_par) of the elliptical polarizer 250.

TABLE 1

Emissive efficiency as a function of non-linearity of the polarizer film

| Polarizer properties | | | Emissive |
|---|---|---|---|
| Total T % | T_perp | T_par | Efficiency |
| 45.1% | 90% | 0.2% | 100% |
| 47.5% | 90% | 5% | 105% |
| 50.0% | 90% | 10% | 111% |
| 52.5% | 90% | 15% | 116% |
| 55.0% | 90% | 20% | 122% |
| 57.5% | 90% | 25% | 127% |
| 60.0% | 90% | 30% | 133% |
| 62.5% | 90% | 35% | 139% |

Optical performance of the display panel may additionally depend upon the design and material selection of the black matrix layer 240. In an embodiment, the black matrix layer 240 material may be selected to have minimal reflection, and particularly reduced diffuse reflection, when laminated onto the display stack. For example, reflection from a typically glossy coating may be characterized as maintaining polarization in the reflected light, while a matt coating may be characterized as having diffusive reflection in which the light is scattered and polarization is not maintained. In accordance with some embodiments, the black matrix layer 240 is designed to reduce reflection, and particularly diffusive reflection.

Suitable materials may include organic dye based absorbers (including mixed molecule dyes) as well as pigment based absorbers. In an embodiment, a carbon-black (C-black) based black matrix material may be utilized including C-black particle aggregates smaller than 150 nm to increase optical absorption. In an embodiment, C-black particle average sizes less than 50 nm are utilized to reduce light scattering, or even less than 20 nm to reduce diffuse reflections from the black matrix layer 240. In such an implementation, it has been observed that low particle sizes (e.g. less than 50 nm) may result in a bluish tinted black matrix layer 240. In such an embodiment, an elliptical polarizer 250 is designed to have an increased absorption in the corresponding blue region compared to the rest of visible spectrum, such as the visible spectrum below 425 nm to reduce visibility of potential color tint due to the C-black particles while not increasing absorption in the region corresponding to a blue LED emission peak. In other embodiments, the black matrix layer 240 may be designed to have absorption spectrum peaks located in between the emissive peaks of the display panel in order to increase transmission and emissive efficiency.

Figure 4:
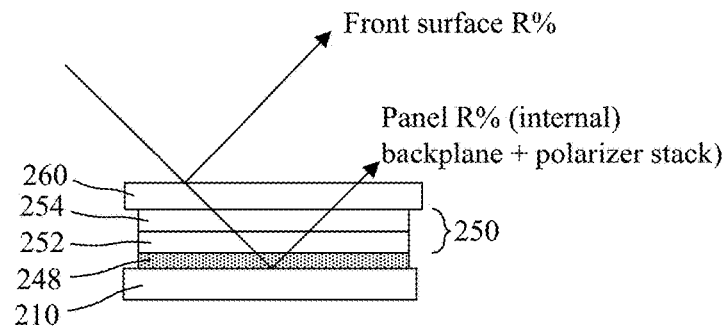
FIG. 4 is a schematic illustration of reflection from a front surface and backplane of a display panel in accordance with an embodiment.

FIG. 4 is a schematic illustration of reflection from a front surface of an elliptical polarizer 250 and the backplane 210 of a display panel in accordance with an embodiment. As shown, ambient light approaching the display panel may be partially reflected prior to reaching the backplane 210. For example, front surface reflection may be from a cover 260 as shown. The light that is reflected internally by the display panel stack may include light that is transmitted to the backplane 210 and reflected from the backplane, as well as light that is reflected by the elliptical polarizer stack. Total internal panel reflection ($R_{TOTAL}$) may be characterized as being proportional to the product of the parallel transmission ($T_{PARALLEL}$) and perpendicular transmission ($T_{PERP}$) through the elliptical polarizer, reflectivity of the backplane ($R_{BP}$) as provided in equation 1.

$$R_{TOTAL} = T_{PARALLEL} * R_{BP} * T_{PERP} \quad (1)$$

Figure 5:
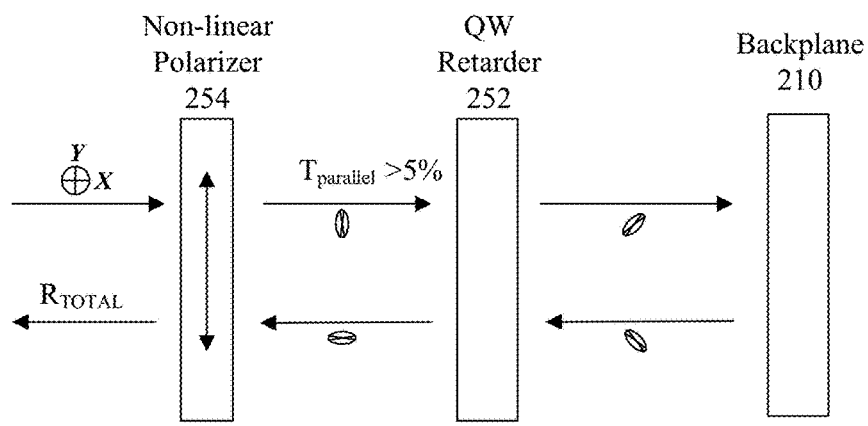
FIG. 5 is a schematic illustration of internal panel reflection in accordance with an embodiment including an elliptical polarizer.

FIG. 5 is a schematic illustration of internal panel reflection ($R_{TOTAL}$) in accordance with an embodiment including an elliptical polarizer. As illustrated, randomly polarized ambient light enters the display panel through the non-linear polarizer layer 254, which transmits a specified amount of polarized light in the parallel ($T_{PARALLEL}$) and perpendicular ($T_{PERP}$) directions, for example, as provided in Table 1. The transmitted light is then shifted a quarter wavelength by the quarter wave retarder layer 252, and then reflected by the backplane 210, with a specified reflectivity ($R_{BP}$). The light reflected by the backplane 210 may be shifted in handedness, and transmitted back through the quarter wave retarder layer 252, where the light is again shifted another quarter wavelength. The light transmitted out through the quarter wave retarder layer 252 is then transmitted out through the non-linear polarizer layer 254, which transmits a specified amount of polarized light in the parallel ($T_{PARALLEL}$) and perpendicular ($T_{PERP}$) directions, for example, as provided in Table 1. The amount of internally reflected light that is transmitted out through the non-linear polarizer layer 254 corresponds to the total internal panel reflection ($R_{TOTAL}$).

Table 2 provides simulation data for total internal panel reflection ($R_{TOTAL}$) as a function of non-linearity of the elliptical polarizer 250, and reflectivity ($R_{BP}$) of the backplane 210. The simulated $R_{TOTAL}$ is provided side by side with the simulated panel efficiency data provided in Table 1. In simulating the total internal panel reflection, the reflectivity of the black matrix layer 240 was measured with varying sizes of openings 242 corresponding to spatially averaged backplane reflectivity $R_{BP}$ values of 10%, 7%, 4%, and 3%. The specific $R_{BP}$ values depend upon factors such as the constituent materials of the black matrix layer and the pixel elements exposed through the black matrix layer openings, and the fill factor of the black matrix layer (e.g. aperture ratio of the openings). In an embodiment, the black matrix layer occupies greater than 80% of the active pixel area on the display backplane. In an embodiment, the black matrix layer occupies 80%-95% of the active pixel area on the display backplane.

TABLE 2

Total internal panel reflection as a function of non-linearity of the elliptical polarizer, and reflectivity of the backplane

| Polarizer properties | | | Emissive Efficiency | Backplane reflectivity ($R_{BP}$) | | | |
|---|---|---|---|---|---|---|---|
| | | | | 10% | 7% | 4% | 3% |
| Total T % | T_perp | T_par | | Total internal panel reflection ($R_{TOTAL}$) | | | |
| 45.1% | 90% | 0.2% | 100% | 0.02 | 0.01 | 0.01 | 0.01 |
| 47.5% | 90% | 5% | 105% | 0.45 | 0.32 | 0.18 | 0.14 |
| 50.0% | 90% | 10% | 111% | 0.90 | 0.63 | 0.36 | 0.27 |
| 52.5% | 90% | 15% | 116% | 1.35 | 0.95 | 0.54 | 0.41 |
| 55.0% | 90% | 20% | 122% | 1.80 | 1.26 | 0.72 | 0.54 |
| 57.5% | 90% | 25% | 127% | 2.25 | 1.58 | 0.90 | 0.68 |
| 60.0% | 90% | 30% | 133% | 2.70 | 1.89 | 1.08 | 0.81 |
| 62.5% | 90% | 35% | 139% | 3.15 | 2.21 | 1.26 | 0.95 |

As provided in Table 2, in accordance with embodiments, a total internal panel reflection ($R_{TOTAL}$) in the range of 0%-2% (such as 0%-1%) may be achieved (excluding module stack front surface R %) while at the same time allowing a more efficient pixel emission output to a viewer compared to a traditional case using a circular polarizer. For example, transmission of emitted light may be increased greater than 50%. This may correspond to gains in emissive efficiency of greater than 10% compared to a traditional case using a circular polarizer.

In utilizing the various aspects of the embodiments, it would become apparent to one skilled in the art that combinations or variations of the above embodiments are possible for fabricating display panels with integrated elliptical polarizers. Although the embodiments have been described in language specific to structural features and/or methodological acts, it is to be understood that the appended claims are not necessarily limited to the specific features or acts described. The specific features and acts disclosed are instead to be understood as embodiments of the claims useful for illustration.

What is claimed is:

1. A display panel comprising:
   an array of emissive LEDs;
   a black matrix layer over the array of emissive LEDs, the black matrix layer including a corresponding array of openings over the array of emissive LEDs, wherein each opening is over a corresponding emissive LED; and
   an elliptical polarizer directly over the black matrix layer, wherein the elliptical polarizer is characterized by a parallel transmission of at least 5% and a perpendicular transmission of at least 90%, and the elliptical polarizer includes:
   a quarter wave retarder layer over the black matrix layer; and
   a non-linear polarizer film over the quarter wave retarder layer.

2. The display panel of claim 1, wherein the elliptical polarizer is characterized by a total transmission of greater than 50%.

3. The display panel of claim 1, wherein the elliptical polarizer is characterized by a parallel transmission of at least 10%.

4. The display panel of claim 1, wherein the elliptical polarizer is characterized by a parallel transmission of at least 15%.

5. The display panel of claim 1, wherein the array of emissive LEDs includes a first group of emissive LEDs designed for emission at a first peak wavelength, and a second group of emissive LEDs designed for emission at a second peak wavelength, and the elliptical polarizer includes a dye characterized by an absorption peak between the first peak wavelength and the second peak wavelength.

6. The display panel of claim 1, wherein the array of emissive LEDs includes a first group of emissive LEDs designed for emission at a first peak wavelength, and a second group of emissive LEDs designed for emission at a second peak wavelength, and the black matrix layer includes a dye characterized by an absorption peak between the first peak wavelength and the second peak wavelength.

7. The display panel of claim 6, wherein the black matrix layer comprises mixed molecule dyes with multiple absorption peaks between the first peak wavelength and the second peak wavelength.

8. The display panel of claim 1, wherein the black matrix layer comprises carbon-black particles with an average particle sizes less than 50 nm.

9. The display panel of claim 8, wherein the elliptical polarizer comprises a dye.

10. The display panel of claim 9, wherein the dye is characterized by an absorption peak in the blue spectrum.

11. The display panel of claim 1, wherein the black matrix layer occupies greater than 80% of an active pixel area on the display backplane.

12. The display panel of claim 1, wherein the black matrix layer occupies 80%-95% of an active pixel area on the display backplane.

13. The display panel of claim 11, wherein the black matrix layer is formed over an array of microdriver chips surface mounted on the display backplane.

14. The display panel of claim 1, wherein:
   the array of emissive LEDs includes a first group of emissive LEDs designed for emission at a first peak wavelength, and a second group of emissive LEDs designed for emission at a second peak wavelength; and
   a component selected from a group consisting of the black matrix layer and the elliptical polarizer includes a dye characterized by an absorption peak between the first peak wavelength and the second peak wavelength.

15. The display panel of claim 14, wherein each opening is narrower than a corresponding emissive LED.

* * * * *